United States Patent [19]

Philbrick et al.

[11] 3,925,119

[45] Dec. 9, 1975

[54] METHOD FOR VAPOR DEPOSITION OF GALLIUM ARSENIDE PHOSPHIDE UPON GALLIUM ARSENIDE SUBSTRATES

[75] Inventors: John W. Philbrick, Poughkeepsie; William C. Wuestenhoefer, Mahopac, both of N.Y.

[73] Assignee: International Business Machines Corporation, Armonk, N.Y.

[22] Filed: July 15, 1974

[21] Appl. No.: 488,639

Related U.S. Application Data

[63] Continuation-in-part of Ser. No. 358,241, May 7, 1973, abandoned.

[52] U.S. Cl. ................ 148/175; 156/610; 156/613; 357/17

[51] Int. Cl.[2] .................. H01L 21/205; H01L 33/00

[58] Field of Search .............. 148/174, 175; 357/17; 117/106 A, 201

[56] References Cited

UNITED STATES PATENTS

| | | | |
|---|---|---|---|
| 3,394,390 | 7/1968 | Cheney | 148/175 X |
| 3,441,000 | 4/1969 | Burd et al. | 148/175 X |
| 3,634,872 | 1/1972 | Umeda | 357/17 X |
| 3,721,583 | 3/1973 | Blakeslee | 148/175 X |
| 3,725,749 | 4/1973 | Groves et al. | 357/17 X |

OTHER PUBLICATIONS

Tietjen, et al., "Preparation . . . $GaAr_{1-x}P_x$ Using Arsine and Phosphine," J. Electrochem. Soc., Vol. 113, No. 7, July, 1966, pp. 724–728.

Burd, J. W.; "Multiwafer Growth . . . GaAs and $GaAr_{1-x}P_x$," Trans. Metallurgical Soc. of Aime, Vol. 245, Mar., 1969, pp. 571–576.

Stewart, C. G. E., "Stoichiometric Effects . . . of $GaAs_{1-x}P_x$," J. of Crystal Growth, Vol. 8, 1971, pp. 259–268.

Tietjen, et al., "Vapor-Phase Growth . . . III-V Compound Semiconductors," Solid State Technology, Oct., 1972, pp. 42–49.

*Primary Examiner*—L. Dewayne Rutledge
*Assistant Examiner*—W. G. Saba
*Attorney, Agent, or Firm*—Wesley DeBruin

[57] ABSTRACT

In the method for the production and deposition of epitaxial films from volatile compounds of gallium, boron and aluminum, and mixtures thereof, and the compounds of phosphorous and arsenic, the improvement is disclosed comprising controlling the total vapor pressure of the gaseous arsenic and phosphorous reactants between limits to produce an ultimate light emitting diode having improved external quantum efficiency.

The ratio of the partial pressures of the group V hydrides to each other, for example, the ratio of the arsine partial pressure to the phosphine is fixed, or determined by the composition desired in the solid, while the ratio of the group III halide partial pressure to the total group V hydride pressure can be varied without changing, or modifying, the composition of the final solid. The prior art teaches that variations in this ratio lead to variations in the quality of the resulting material.

Applicants have discovered that the quality of the resulting semiconductor material, as measured by the quantum efficiency of a light emitting diode made from it is more sensitive to the total pressure of the reacting gasses ($P_{HCl} + P_{AsH_3} + P_{PH_3}$) than it is to the ratio ($P_{HCl}/(P_{AsH_3} + P_{PH_3})$), the ratio between the group III halides vapor pressure to the group V hydride vapor pressure.

10 Claims, 2 Drawing Figures

METHOD FOR VAPOR DEPOSITION OF GALLIUM ARSENIDE PHOSPHIDE UPON GALLIUM ARSENIDE SUBSTRATES

This application is a continuation in part of U.S. patent application Ser. No. 358,241, filed May 7, 1973, now abandoned.

Background of the Invention

1. Field of the Invention

The present invention relates to a method for the production of epitaxial films of single crystals of inorganic compounds. Epitaxial films which may be prepared in accordance with the invention described in this specification are prepared from volatile compounds of such elements as gallium, boron and aluminum of Group III*b* of the periodic system and reacted with volatile compounds of elements of phosphorous and arsenic of Group V*b* of the periodic system. Typical resulting compounds within this group include the binary compounds gallium arsenide, boron phosphide, gallium phosphide, and the like, as well as ternary compositions within the group heretofore mentioned and having the formula, for example, $GaAs_{1-x}P_x$ where $x$ has a numerical value greater than 0 and less than 1.

The epitaxial films of the present invention are characterized as having a composite structure of graded energy gap crystal and constant energy gap crystal. A graded energy gap crystal is characterized by non-uniformity of composition which results in a corresponding non-uniformity in the forbidden energy gap of the material. The non-uniformity of the forbidden energy gap may be one of gradual increase or decrease in a given direction in a linear or non-linear manner or any other type of profile. The range over which the forbidden energy gap can vary is naturally governed by the elemental components that make up the crystal. When, for example, gallium arsenide phosphide is desired to be vapor deposited upon a gallium arsenide monocrystalline substrate, the vapor reactants are controlled so that the first crystal deposition is that of the substrate gallium arsenide. Subsequently, gradual process variations are made to produce a gradual change from the monocrystalline binary gallium arsenide to the monocrystalline ternary gallium arsenide phosphide in the material deposited on the substrate, such as gallium arsenide. The region between the binary and fixed ternary composition region is referred to as the graded area. The fixed ternary composition is known as the constant composition area or thickness in which area the diode devices are made.

This invention further relates to such process control of gaseous reactants so as to produce an epitaxial layer of material from which a light emitting diode can be produced having improved external quantum efficiency.

2. Description of the Prior Art

Reference is made to the following publications: "Stoichiometric Effects in the Growth of Doped Epitaxial Layers of $GaAs_{1-x}P_x$" by C. E. E. Stewart, Journal of Crystal Growth 8 (1971), North-Holland Publishing Co., Pages 259 through 268.

"Some Observations on the Dislocation Etching of $GaAs_{1-x}P_x$ Epitaxial Layers" by C. E. E. Stewart, Journal of Crystal Growth 8 (1971), North-Holland Publishing Co., Pages 269 through 275.

It is known to prepare III-V compounds by interacting two gaseous mixtures. The first gaseous mixture is produced by contacting a hydrogen halide with a Group III element such as gallium at a temperature sufficiently high to react these components. The second gaseous mixture is formed by contacting a stream of gaseous hydrogen with a Group V element or a volatile Group V compound at a temperature insufficient to cause reaction with the hydrogen. The hydrogen under these conditions serves primarily as the carrier for the Group V element or compound. The two gaseous mixtures are then intermixed in a reaction tube or any other suitable apparatus at a temperature sufficient to deposit the III-V compound as an epitaxial film on a seed crystal substrate situated in the reaction apparatus. Generally speaking, the III-V compound vapor deposits from the reaction mixture onto the substrate.

The temperature used to carry out the reaction between the described Group III element-hydrogen halide reaction mixture and the Group V element-hydrogen mixture will be somewhere in the neighborhood of above 150°C and a preferred operating range is known to be about 400°C to 1300°C.

In carrying out the vapor phase reaction between the Group III reaction mixture and the Group V hydrogen mixture for the production of a crystalline solid group III-V compound, it is essential that the gaseous hydrogen be present in the system when the Group V component is a hydride and that oxidizing gases are excluded.

The Group V starting materials include elemental phosphorous, arsenic, and the like, and volatile compounds thereof such as the corresponding hydrides and alkyl compounds. Preferred compounds are hydrides, such as arsine and phosphine. The typical III-V compounds within this group include the binary compounds boron phosphide, gallium arsenide, indium arsenide, gallium phosphide and indium phosphide. As an example of ternary compositions within the group are those having the formula $GaAs_{1-x}P_x$ and such compounds as $InAs_xP_{1-x}$ where $x$ has a numerical value greater than 0 and less than 1.

The aforementioned prior art methods are more definitively disclosed in U.S. Pat. Nos. 3,218,205 and 3,364,084 entitled, respectively, "The use of Hydrogen Halide and Hydrogen in Separate Streams as Carrier Gases in Vapor Deposition of III-V Compounds" and "Production of Epitaxial Films". It is also known and has been described as heretofore mentioned that the materials used for the production of epitaxial films or monocrystalline substrates, or both, may be used in a purified state or containing small amounts of foreigh materials as "doping" agents, for example, zinc or tellurium.

Summary of the Invention

It is an object of this invention to provide a method for producing a Group III-V monocrystalline compound or mixtures thereof suitable for use as substrates in the manufacture of light emitting diodes having improved external quantum efficiency.

It is still another object of this invention to provide a process whereby elements or compounds or mixtures thereof of Group III and Group V of the periodic system are reacted in the gaseous state to produce binary or ternary III-V crystalline structures capable of being utilized as substrates for the manufacture of light emitting diode junctions.

It is still a further object of this invention to chemically deposit from the vapor state Group III-V compounds or mixtures thereof under controlled vapor pressure conditions and providing monocrystalline substrate material capable of providing light emitting diode PN junctions having improved quantum external efficiency characteristics.

The foregoing and other objects, features and advantages of the invention will be apparent from the following more particular description of preferred embodiments of the invention as illustrated in the accompanying drawings and which is broadly accomplished by reacting a Group III element such as gallium with a hydrogen halide at an elevated temperature and combining and reacting the resultant Group III halide with a mixture of Group V hydrides at a vapor pressure between $7 \times 10^{-3}$ and $35 \times 10^{-3}$ atmospheres at a temperature between 740°C and 800°C, with the ratio of Group III halide vapor pressure to Group V hydride vapor pressure held constant within the range of 0.5–1.0, and depositing the resultant reaction products onto a solid monocrystalline substrate material. A preferred partial pressure range of phosphine and arsine is between $10 \times 10^{-3}$ and $24 \times 10^{-3}$ atmospheres.

The ratio of the partial pressures of the Group V hydrides to each other, that is, the ratio of the arsine partial pressure to the phosphine partial pressure is fixed by the composition desired in the solid, while the ratio of the Group III halide partial pressure to the total Group V hydride vapor pressure can be varied without changing the composition of the final solid. The prior art (see in particular the Stewart publications identified below) teach that variations in this III-V ratio lead to variations in the quality of the resulting material; applicants findings are that the quality of the resulting semiconductor material as measured by the quantum efficiency of a light emitting diode made from it is more sensitive to the total pressure of the reacting gasses ($P_{HCl}+P_{AsH_3}+P_{PH_3}$) than it is to the ratio $P_{HCl}/(P_{AsH_3}+P_{PH_3})$, the ratio between the Group III halides vapor pressure to the Group V hydride vapor pressure. Reference is made to the publications by C. E. E. Stewart identified as follows: "Stoichiometric Effects in Growth of Doped Epitaxial Layers of $GaAs_{1-x}P_x$" by C. E. E. Stewart, Journal of Crystal Growth 8 (1971), North-Holland Publishing Co., pages 259 through 268. "Some Observations on Dislocation Etching of $GaAs_{1-x}P_x$ Epitaxial Layers" by C. E. E. Stewart, Journal of Crystal Growth 8 (1971) North-Holland Publishing Co., pages 269 through 275.

Reference is made to the following publication. "Influence of Reactant Gas Vapor Pressure on the Electrical Properties and the Electroluminescent Efficiency of $GaAs_{0.62}P_{0.38}$" by J. W. Philbrick and W. C. Wuestenhoefer, Journal of Electronic Materials, Vol. 3, No. 2, 1974, pages 475 through 495 "(Received Aug. 26, 1973; revised Nov. 5, 1973)."

The text of the afore-identified publication by applicants' is incorporated herein by reference, as though its entire text was set-forth herein. A reprint of the afore-identified publication was filed in, and a request made that the publication be made of record in the parent application.

Reference is made to U.S. Pat. No. 3,821,033 entitled "Method for Producing Flat Composite Semiconductor Substrates" granted to Shih-Ming Hu on June 28, 1974, (Ser. No. 277,531, filed Aug. 3, 1972) and of common assignee herewith.

The practice of the invention is not limited to any particular structure or system. For example, an "AMG. 350 Reactor System" or an "AMG. 500 Reactor System" may be employed to practice applicants' invention. Each of the above-recited Reactor systems are extensively employed in the industry. Each of the afore-identified Reactor Systems are commercially available from Applied Materials Inc. 2999 San Ysidro Way, Santa Clara, California, 95051.

Figure 1:
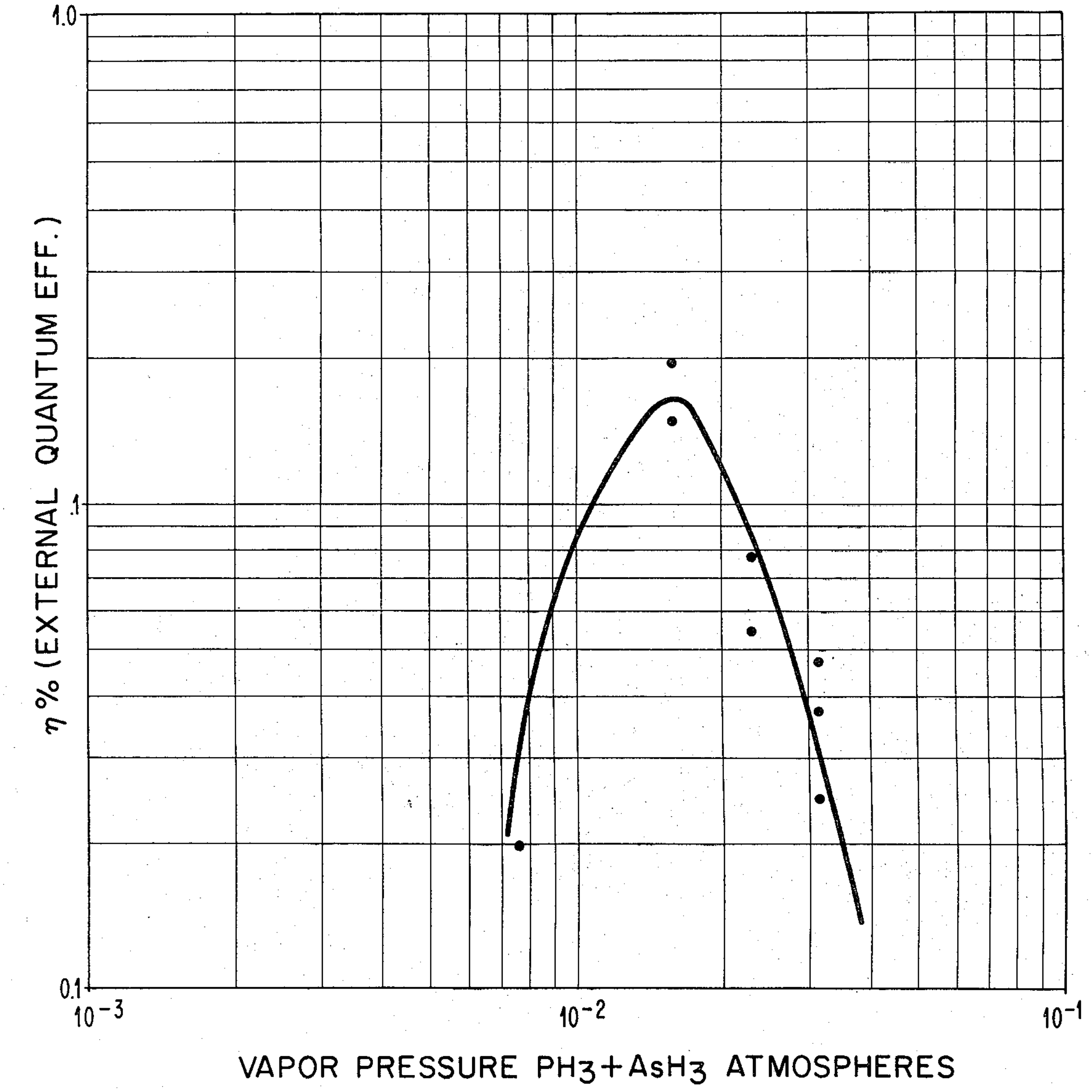
FIG. 1 is a graphical log log representation of the vapor pressure of phosphine and arsine Group V compounds versus the external quantum efficiency of a light emitting diode produced utilizing a substrate produced in accordance with the method of this invention.
Figure 2:
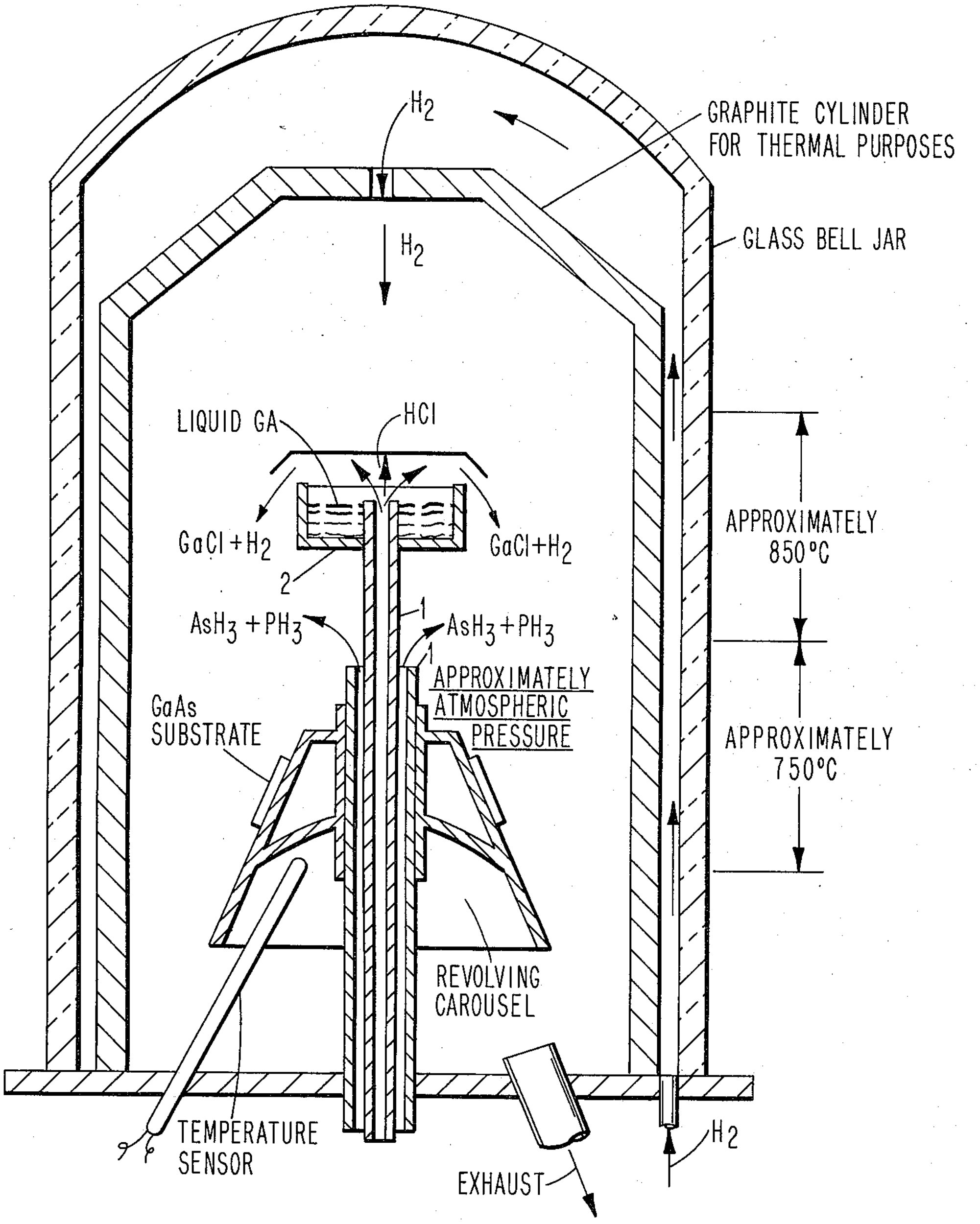
FIG. 2 depicts a simplified schematic of apparatus that may be employed to practice applicants' invention.

The apparatus depicted in FIG. 2 is a simplified showing of apparatus generally of the type employed in the "AMG. 350 Reactor System" and the "AMG. 500 Reactor System," identified above.

The practice of the invention is not system limited. The practice of the invention is essentially predicated on the vapor pressure of the reactant gases in the chamber. The total pressure within the chamber is essentially one atmosphere. For example, if the flow rate were increased to something greater than 3000 c.c./minute the reactant gas flow rate would also be increased to maintain the same vapor pressure. The converse is also true. Thus, the partial pressures are not system dependent.

Referring to FIG. 2 the growth cycle may be simply and briefly described as follows:

1. GaAs wafer (the substrate) is placed in the chamber heated up to the appropriate temperature.
2. an epitaxial (epi) layer of GaAs is grown.
3. after the first epi layer (namely GaAs) $PH_3$ is introduced along with the dopant (which is also in the GaAs epi) through the outer portion of coaxial tubes 1 (FIG. 2). The $AsH_3$, $PH_3$ and the dopant all are provided in common by the same portion of tubes 1. The $PH_3$ is introduced in a ramped fashion, that is, increased from an initial flow rate of 0 to the desired final flow rate chosen to be in the proper ratio to the $AsH_3$ flow rate to yield an epitaxial layer of the desired final composition. This permits one to go from GaAs to the desired $GaAs_{1-x}P_x$ composition over a controlled time period.
4. The HCl enters the Ga reservoir 2 via the center portion of the coaxial tubes 1. It forms GaCl with the liquid Ga which is directed downward toward the wafer by the main stream, $H_2$ flow. This flow also directs the $AsH_3$, $PH_3$ and dopant. It is the total flow which makes up the atmospheric pressure, with the partial pressure of $AsH_3+PH_3+$dopant/gas. The system is considered an atmospheric reaction.

Description of the Preferred Embodiments

The following specific examples will illustrate specific embodiments of this invention. An apparatus of suitable means for holding substrate wafers was provided as well as being capable of being heated to process temperature conditions while accommodating the gaseous III-V reactants within the reaction chamber and wherein a reservoir of gallium is maintained in proximity to an HCl gas outlet and oversweep, with appropriate means for directing only HCl gas on the substrate wafers.

Example I

Tin doped gallium arsenide wafers of from 15 to 18 mils thickness, polished to a featureless surface were provided. The substrate wafers were misoriented about 3° from the (100) axis toward the (111) orientation. Said wafers were etched for about 15 seconds in a conventional 1:1:2 ammonium hydroxide, hydrogen peroxide, deionized water solution followed by a water wash and dried in flowing filtered nitrogen.

After the wafer substrates were mounted and secured in the reaction chamber, a 15 minute high hydrogen purge was effected at a rate of 5 liters per minute. The temperature in the chamber increased to about 600°C followed by establishing a constant flow of 37.8cc $AsH_3$ per minute in hydrogen. A flow of HC1 gas was concurrently directed over the wafers at a rate of approximately 30.9cc per minute for 2 minutes after which reactor temperature is increased to about 780°C–790°C whereupon HC1 is swept over the gallium reservoir for 5 minutes for the initial deposition of a thin gallium arsenide film and continued for the remainder of growth period. $PH_3$ was then gradually injected into the chamber from 0 flow to a flow of 9.7cc per minute in hydrogen whereby a graded area was produced in about 72 minutes having a thickness of about 100 microns. The flow rate of phosphine was maintained at 9.7cc per minute for a period of 102 minutes producing a constant composition region having a thickness of about 100 microns. During the entire growth period, 0.1 parts per million of di-methyltelluride was injected into the system as a telluride dopant. The total flow through the reactor of reactant gases and hydrogen was maintained at 3000cc per minute. The total run or growth period was maintained for a total time of about 179 minutes after which the HCl to gallium flow was terminated and a high hydrogen purge initiated after which the $PH_3$ flow was cut and the temperature reduced to about 600°C at which point $AsH_3$ flow was eliminated and when the temperature reached about 25°C, or room temperature, the system was purged with $N_2$ and the wafers removed. Partial pressure of $PH_3$ and $AsH_3$ at a total gas flow of 3000cc per minute was $15.45 \times 10^{-3}$ atmospheres, the partial pressure of HCl was $10.5 \times 10^{-3}$ atmospheres, for a III/V ratio of 0.65, and light emitting diodes manufactured in accordance with well known diffusion methods within the constant composition zone or area exhibited an external quantum efficiency of 0.15 to 0.19%.

Example II

The same procedure as delineated in Example I was followed except that actual $PH_3$ flow was 4.8cc per minute and the actual $AsH_3$ flow was 18.9cc per minute and the same total gas flow of 3000cc per minute. HCl flow was increased to 16.5cc per minute to maintain a III/V ratio of 0.71. All makeup or diluent gas was hydrogen. The resulting partial pressure of arsine and phosphine was $7.8 \times 10^{-3}$ atmospheres and the resulting light emitting diodes exhibited an external quantum efficiency of 0.02%.

Example III

The same procedure as in Example I was followed except that the phosphine and hydrogen flow was 144cc per minute or 14.4cc per minute of actual $PH_3$. Similarly, the total hydrogen and arsine flow was 810cc per minute or 56.6cc per minute actual $AsH_3$. HCl flow was 53.4cc per minute for a III/V ratio of 0.77. These conditions produced a $PH_3$ and $AsH_3$ partial pressure of $23.18 \times 10^{-3}$ atmospheres and upon fabrication of light emitting diode devices in said material, said devices had an external quantum efficiency of from 0.057 to 0.07%.

Example IV

Example I procedure was followed with total phosphine and arsine per se partial pressure of $30.9 \times 10^{-3}$ atmospheres. This required a $PH_3$ flow of 19.2cc per minute in 192cc per minute of hydrogen and 73.5cc per minute $AsH_3$ flow in 1050cc per minute hydrogen. HCl partial pressure was $21.9 \times 10^{-3}$ atmospheres for a III/V ratio of 0.71. The light emitting diodes, utilizing a substrate produced in accordance with this Example, exhibited an external quantum efficiency of from 0.025 to 0.038%.

In each of the foregoing examples, a total system flow of 3000cc per minute was maintained, utilizing hydrogen as a diluent or carrying gas. Also in each of the foregoing examples, gasses were vented from the apparatus in such fashion as to maintain essentially atmospheric pressure throughout.

Pursuant to well known diffusion techniques for the production of diodes, the material produced in accordance with this invention was diffused with a P-type impurity (zinc), thinned by lapping to remove part of the substrate, soldered to a header to make contact to the N-type region, wire bonded to the diffused region to form the anode contact, and the light emitted under forward bias measured by measuring the output of a suitable calibrated light detector which is so placed to intercept all or a known fraction of the emitted light.

The diodes are usually prepared by conventional diffusion methods. This conventionally comprises sealing substrates in a quartz tube with a small amount of suitable zinc source material, for example, zinc in gallium arsenide powder. The tube is evacuated to a pressure of about $10^{-6}$ torr, then sealed using conventional flame techniques. It is placed into a furnace at 700°C and allowed to remain there for an appropriate period of time, after which it is removed, allowed to cool to room temperature, opened and the material removed.

The actual diode is fabricated by thinning the sample by lapping, cleaving it to a convenient size, soldering it to a gold plated header, and forming an ultrasonic bond to the P-region for the anode contact. The typical 18 mils thick sample is lapped to a thickness of approximately 6 mils by waxing it to a steel block or other fixture, and rubbing it on a glass plate covered with a slurry of water and a fine abrasive. The sample and block are then ultrasonically cleaned in deionized water, and the sample removed from the block, cleaned in acetone, and dried. Several smaller pieces are then cleaved out of the sample to sizes of typically a few mils on a side. These dice are then, individually or in groups of two or three, soldered N-side down to a gold plated header using tellurium doped tin for solder, and working in a reducing atmosphere. This step both physically mounts the samples onto the header and forms the cathode contact for the devices. The anode contact is formed by ultrasonically bonding a wire from one of the pins on the header to each of the exposed P-regions, thus forming the anode contact.

The devices are tested for light output by passing a known current through each device in turn, and measuring the total light emitted by the tested device by measuring the output of a light detector such as a solar cell placed so as to capture all or a known fraction of the light emitted by the diode. In more detail, typically each diode in turn is placed such that its emission will be captured by the detector, and is forward biased at a number of different amounts of forward current. The output of the detector is measured for each value of diode current, and interpreted in terms of the total number of photons per unit time emitted by the diode. The ratio of emission rate (photons per second) to bias current (in electrons per second) is the total external quantum efficiency.

Though the data taken in support of this invention was taken in the fashion described above, a similar dependency would have been observed if the devices were diffused and fabricated in another fashion, and if another quality describing the light emission, such as brightness or luminance or output power, was measured.

While the invention has been particularly shown and described with reference to the preferred embodiments thereof, it will be understood by those skilled in the art that the foregoing and other changes in form and detail may be made therein without departing from the spirit and scope of the invention.

What is claimed is:

1. A method for producing an epitaxial film of gallium arsenide phosphide on a gallium arsenide substrate where the electroluminescent efficiency of said film of gallium arsenide phosphide is enhanced, said method comprising reacting in the vapor state and depositing therefrom in the presence of hydrogen the reaction product of gallium and a hydrogen halide combined with arsenic and phosphorous hydride at a partial pressure between $7 \times 10^{-3}$ and $35 \times 10^{-3}$ atmospheres at a temperature between 740°C and 800°C, while a substantially constant ratio between the Group III and Group V vapor pressure in a range of 0.5 to 1.0 is maintained and a total pressure of essentially atmospheric pressure.

2. A method in accordance with claim 1 wherein said hydrogen halide is hydrogen chloride.

3. A method in accordance with claim 1 wherein said partial pressure of arsine and phosphine is between $10 \times 10^{-3}$ and $24 \times 10^{-3}$ atmospheres.

4. A method in accordance with claim 1 wherein said arsenic and phosphorous hydride is arsine and phosphine.

5. A method in accordance with claim 1 wherein the total gas flow is 3 liters per minute.

6. A method for production and deposition of epitaxial films of gallium arsenide phosphide on gallium arsenide substrates which comprise reacting in the vapor state and depositing therefrom in the presence of hydrogen the reaction product of gallium and a hydrogen halide combined with arsenic and phosphorous hydride at a partial pressure of approximately $15.45 \times 10^{-3}$ atmospheres at a temperature between 740°C and 800°C, hydrogen halide partial pressure of approximately 10.5 $10^{-3}$ $^{10-}$ atmospheres for a substantially constant ratio between the Group III to Group V vapor pressure of 0.65 and a total pressure of essentially 1 atmosphere.

7. A method in accordance with claim 6 wherein said hydrogen halide is hydrogen chloride.

8. A method in accordance with claim 6 wherein said partial pressure of arsine and phosphine is between $10 \times 10^{-3}$ and $24 \times 10^{-3}$ atmospheres at a substantially constant ratio between Group III and Group V vapor pressures in the range of 0.5 to 1.0.

9. A method in accordance with claim 6 wherein said arsenic and phosphorous hydride is arsine and phosphine.

10. A method in accordance with claim 6 wherein the total gas flow is 3 liters per minute.

* * * * *

UNITED STATES PATENT OFFICE
CERTIFICATE OF CORRECTION

PATENT NO. : 3,925,119
DATED : December 9, 1975
INVENTOR(S) : John W. Philbrick et al It is certified that error appears in the above-identified patent and that said Letters Patent are hereby corrected as shown below:

| | |
|---|---|
| Col. 2, line 51 | "foreigh" should read - - foreign - -. |
| Col. 8, lines 21 and 22 | "approximately 10.5 $10^{-3}$ 10- atmospheres" should read - - approximately 10.5 x $10^{-3}$ atmospheres - -. |

Signed and Sealed this

*thirteenth* Day of *April 1976*

[SEAL]

*Attest:*

RUTH C. MASON
*Attesting Officer*

C. MARSHALL DANN
*Commissioner of Patents and Trademarks*